United States Patent
Bala

(10) Patent No.: US 10,734,093 B1
(45) Date of Patent: Aug. 4, 2020

(54) CHASSIS MOUNTING FOR COMPUTING DEVICES

(71) Applicant: HEWLETT PACKARD ENTERPRISE DEVELOPMENT LP, Houston, TX (US)

(72) Inventor: Sunil Rao Ganta Papa Rao Bala, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 2 days.

(21) Appl. No.: 16/263,838

(22) Filed: Jan. 31, 2019

(51) Int. Cl.
*G12B 9/10* (2006.01)
*H05K 5/02* (2006.01)
*H05K 7/18* (2006.01)

(52) U.S. Cl.
CPC ............. *G12B 9/10* (2013.01); *H05K 5/0204* (2013.01); *H05K 7/183* (2013.01)

(58) Field of Classification Search
None
See application file for complete search history.

(56) References Cited

U.S. PATENT DOCUMENTS

| | | | |
|---|---|---|---|
| 5,904,592 A | 5/1999 | Baran | |
| 6,563,710 B1 | 5/2003 | Okuda | |
| 6,704,815 B1* | 3/2004 | Morikawa | H01R 9/2675 700/19 |
| 7,265,966 B2 | 9/2007 | Dudley | |
| 8,003,899 B2 | 8/2011 | WenLong | |
| 8,614,890 B2 | 12/2013 | Hensley | |
| 9,485,879 B2* | 11/2016 | Molnar | H05K 5/0026 |
| 9,632,112 B2* | 4/2017 | Harding | G01R 22/065 |
| 9,686,875 B2* | 6/2017 | Miyake | H05K 7/1471 |
| 9,755,384 B2* | 9/2017 | Bury | H01R 9/26 |
| 2005/0110481 A1* | 5/2005 | Dudley | H05K 5/0017 324/156 |
| 2005/0248925 A1* | 11/2005 | Cane | H05K 5/061 361/737 |
| 2008/0291643 A1* | 11/2008 | Farago | H02B 1/044 361/747 |
| 2009/0152416 A1* | 6/2009 | Kim | H05K 5/0204 248/205.1 |
| 2010/0103627 A1* | 4/2010 | Nelson | G05B 19/0421 361/730 |
| 2011/0261549 A1* | 10/2011 | Chao | H02B 1/052 361/814 |

(Continued)

FOREIGN PATENT DOCUMENTS

EP 3242362 11/2017

*Primary Examiner* — Xanthia C Cunningham
(74) *Attorney, Agent, or Firm* — Nolte Intellectual Property Law Group

(57) ABSTRACT

Systems and methods for mounting a computing device. One system includes a wall mounting bracket having a front side and a back side. The system further includes a main chassis having a front side panel removably connected to the front side of the wall mounting bracket, a second side panel removably connected to the front side of the wall mounting bracket, and a computing device having a first side and a second side, the first side removably attached to the first side panel and the second side removably attached to the second side panel, and the main chassis connected to the front side of the wall mounting bracket.

20 Claims, 12 Drawing Sheets

(56) References Cited

U.S. PATENT DOCUMENTS

| | | | | |
|---|---|---|---|---|
| 2012/0199375 A1* | 8/2012 | Yamamoto | ............ | H02G 3/0437 |
| | | | | 174/68.3 |
| 2013/0214109 A1* | 8/2013 | Yu | ................. | H02B 1/0526 |
| | | | | 248/298.1 |
| 2013/0216304 A1* | 8/2013 | Schumacher | ........ | H01R 13/633 |
| | | | | 403/376 |
| 2013/0264919 A1* | 10/2013 | Sullivan | ............... | H05K 5/0204 |
| | | | | 312/223.2 |
| 2014/0199864 A1* | 7/2014 | Devanand | ............ | H01R 9/2608 |
| | | | | 439/116 |
| 2014/0357117 A1* | 12/2014 | Deshpande | ............ | H02B 1/052 |
| | | | | 439/532 |
| 2016/0286679 A1* | 9/2016 | Bury | .................... | H05K 7/1474 |
| 2016/0349721 A1* | 12/2016 | Kang | ......................... | G05F 1/66 |
| 2017/0367208 A1* | 12/2017 | Mielnik | ................ | H05K 7/1474 |
| 2020/0015360 A1* | 1/2020 | Berberich | ............ | B23K 1/0016 |

\* cited by examiner

CHASSIS MOUNTING FOR COMPUTING DEVICES

BACKGROUND

Computing devices, such as general-purpose computers, servers, routers, switches, storage devices networking devices, etc., may be installed at specified locations, such as fixed physical locations or mobile locations. Such computing devices may be subject to environmental conditions, such as heat, shock, and/or vibration. The computing devices may also be subject to updates as technology changes or the operation in which they are employed changes.

DETAILED DESCRIPTION

Figure 1:
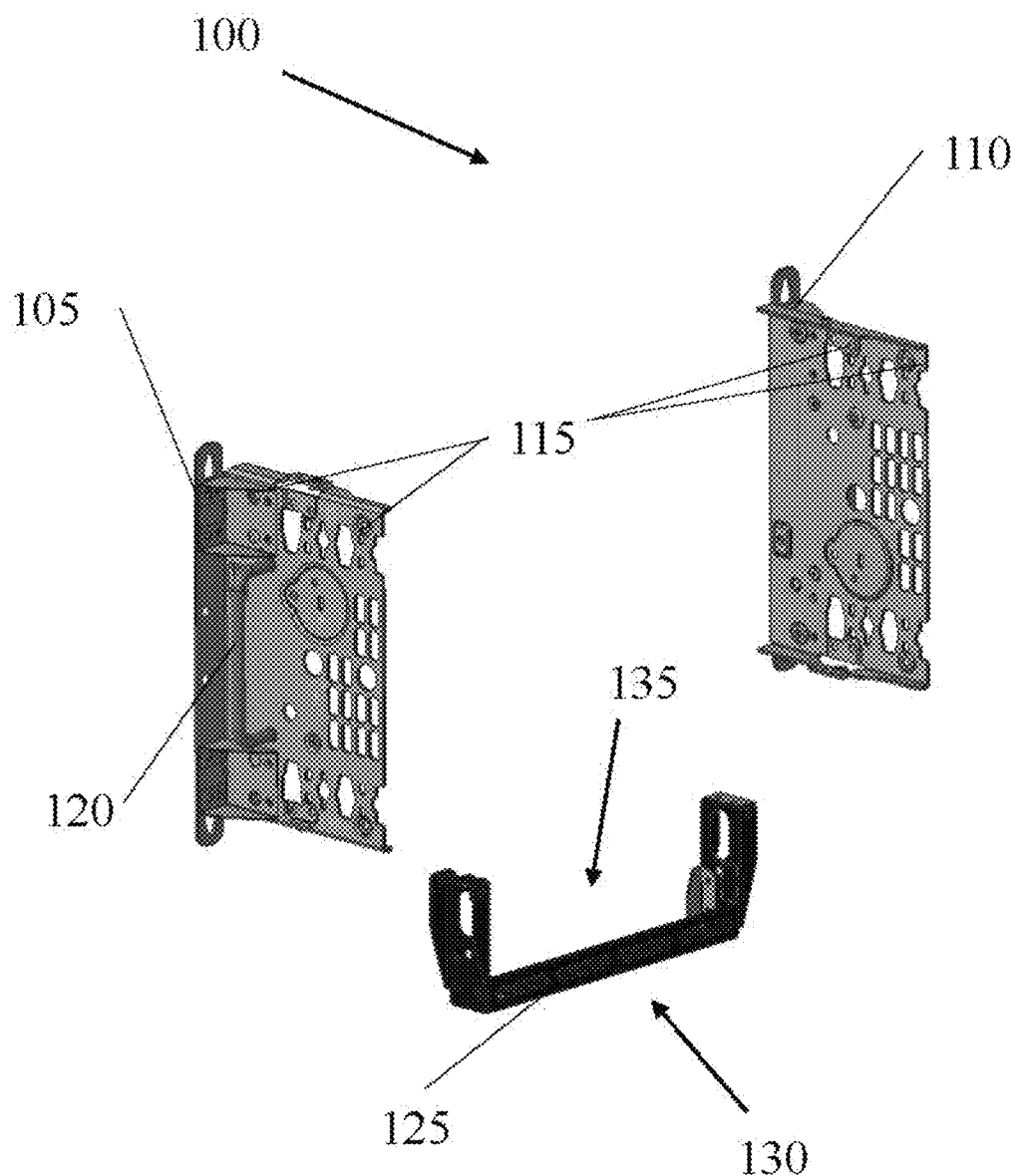
FIG. 1 is a disassembled perspective view of a mounting device, according to one or more examples of the present disclosure.

One or more examples are described in detail with reference to the accompanying figures. For consistency, like elements in the various figures are denoted by like reference numerals. In the following detailed description, specific details are set forth in order to provide a thorough understanding of the subject matter claimed below. In other instances, well-known features to one of ordinary skill in the art having the benefit of this disclosure are not described to avoid obscuring the description of the claimed subject matter.

Computing devices may be installed in a number of different locations. Some locations may be fixed, such as homes, offices, datacenters, and the like. Other locations may be mobile, such as mobile offices, vans, trucks, and mobile work environments. As such, computing devices may be installed in various environments. For example, certain environments may have different mounting substrates, e.g., hollow walls, brick, concrete, metal, DIN rails, etc. Other environments may include exposure to heat, cold, lack of air flow, shock, vibration, etc. Accordingly, computing devices may be exposed to any number of installation and environmental situations.

In order to provide computing devices that may be flexible enough to install in a variety of environments, custom mounting configurations may be used. While such custom mounting configurations may allow the computing devices to be installed and function as intended, the custom configurations may not provide scalability and/or adaptability as circumstances change. Additionally, custom configurations may be different for each implementation, thereby resulting in a configuration that may not be scalable.

Systems and methods of the present disclosure may provide scalable mounting and installation options for computing devices. As such, computing devices using such mounting and installation systems and methods may be scalable and adaptable to fit installation criteria for a number of environments. For example, mounting devices may be installed in various substrates, such as hollow walls, brick, concrete, metal, and on DIN rails, as discussed above. Additionally, aspects of such mounting devices may allow computing devices to be installed in areas that experience vibration and/or shock. Similarly, the mounting devices may be installed in either fixed or mobile locations. Such mounting devices may allow computing devices to be scalable, thereby allowing the devices to be updated and/or changed without replacement of the entire system.

Additionally, aspects of the present disclosure may allow for the vertical stacking of computing devices, thereby allowing the devices to be mounted on walls. The mounting devices may also allow for the vertical expansion of the computing devices, thereby providing adaptability to changing requirements of specific implementations. The systems and methods described below may thereby provide scalable and adaptable mounting options for computing devices.

Turning to FIG. 1, a disassembled perspective view of a mounting device, according to one or more examples of the present disclosure is shown. In this implementation, mounting device 100 may include a first side panel 105 and a second side panel 110. First side panel 105 and second side panel 110 may be manufactured from various materials, such as metals, metal alloys, composites, and the like. In one implementation, first side panel 105 and second side panel 110 may be formed from stainless steel.

First side panel 105 and second side panel 110 may further include one or more apertures 115 that are configured to receive a securing device (not shown). Securing devices may include screws, bolts, rivets, and/or other physical securing devices. During installation, as will be discussed in detail below, securing devices may be removably inserted through apertures 115, thereby allowing computing devices (not shown) and/or other components to be removably attached to first side panel 105 and second side panel 110.

Mounting device 100 may further include one or more handles 120 disposed on first side panel 105 and/or second side panel 110. Handle 120 may be removably attached to first side panel 105 and/or second side panel 110 through securing devices (not shown) such as those discussed above. In operation, two handles 120, one on first side panel 105 and one (not shown) on second side panel 110, may allow for easier lifting of computing devices to a mounting location.

Mounting device 100 may also include a cable management bracket 125. Cable management bracket 125 may be formed from plastics, composites, metals, or other materials that allow cables to be inserted therethrough. During assembly, cable management bracket 125 may be removable attached to first side panel 105 and second side panel 110 with one or more securing devices (not shown), such as those discussed above. Cable management bracket 125 may allow one or cables to be inserted from a basal end 130 through cable management bracket 125 and exit a top end 135. The cables may then be inserted into one or more computing devices installed within first side panel 105 and second side panel 110.

Figure 2:
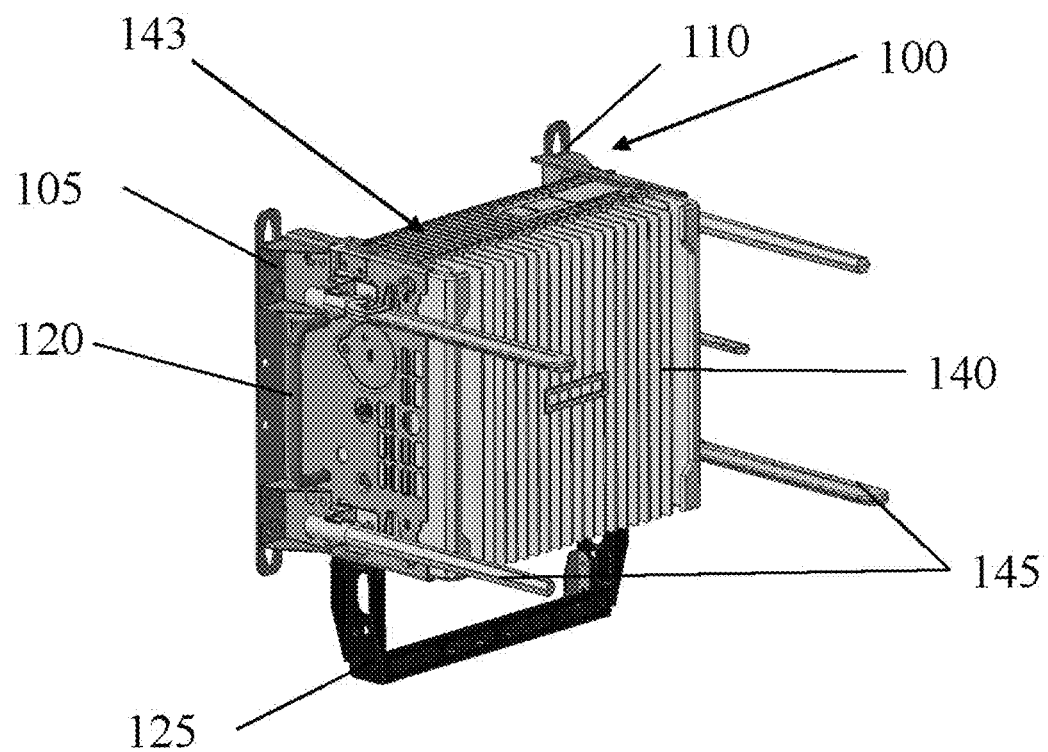
FIG. 2 is a perspective view of a computing device in a mounting device, according to one or more examples of the present disclosure.

Referring to FIG. 2, a perspective view of a computing device 140 in a mounting device, according to one or more examples of the present disclosure is shown. In this example, computing device 140 is illustrated installed in mounting device 100 of FIG. 1. The combination of computing device 140, first side panel 105, and second side panel 110 may thereby form a main chassis 143. Main chassis 143 may also include other components, such as cable management bracket 125, handle 120, and/or other components that may be discussed in detail below.

Computing device 140 may include various components, such as processors, memory, storage devices, network communication devices, audio/video devices, peripheral component interconnect express ("PCI-E") devices, etc. Computing device 140 may also include one or more antennas 145. As illustrated, computing device 140 includes five antennas 145, however, in other examples, computing device 140 may include two antennas 145, three antennas 145, or more than five antennas 145. In yet another example, the computing device 140 may not have an antenna 145.

Figure 3:
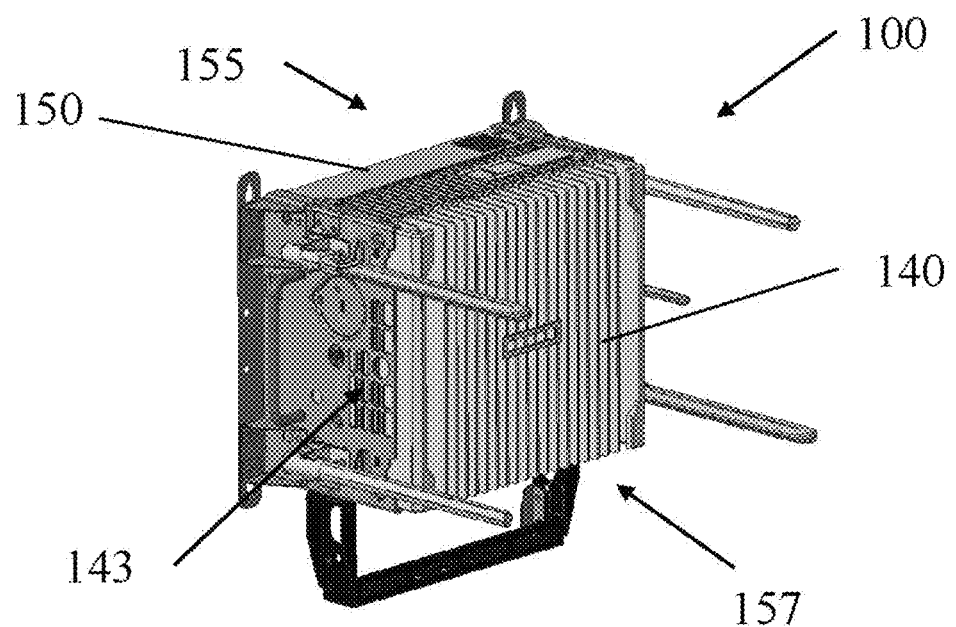
FIG. 3 is a perspective view of a computing device and an expansion unit in a mounting device, according to one or more examples of the present disclosure.

Referring to FIG. 3, a perspective view of computing device 140 and an expansion unit 150 in mounting device 100, according to one or more examples of the present disclosure is shown. FIG. 3 shows mounting device 100 and computing device 140 that include substantially the same components as explained above with respect to FIG. 2. In this example, expansion unit 150 is attached to a distal end 155 of computing device 140. Accordingly, in this implementation main chassis 143 includes at least first side panel 105, second side panel 110, computing device 140, and expansion unit 150.

Expansion unit 150 may include additional computing components, thereby expanding the functionality of computing device 140. For example, expansion unit 150 may include additional memory, storage devices, PCI-E devices, network communication devices, or other devices that may be used in particular implementations.

To connect expansion unit 150 to computing device 140, a connector (not shown) on a proximate end 157 of expansion unit 150 may be connected to a matching connector (not shown) on distal end 155 of computing device 140. In one example, the connector on expansion unit 150 may be a male connector, while the matching connector on computing device 140 may be a female connector. In other examples, other types of connectors that include mutually complementing geometries may be used to connect expansion unit 150 to computing device 140. The connection of expansion unit 150 and computing device 140 may thereby allow for the exchange of data therebetween.

Because computing device 140 is configured to receive expansion unit 150, the functionality of computing device 140 may be modified without having to replace the entire computing device 140 with a new device. As such, computing device 140, when installed in mounting device 100, may provide a scalable option for mounting computing devices 140 at various locations.

Figure 4:
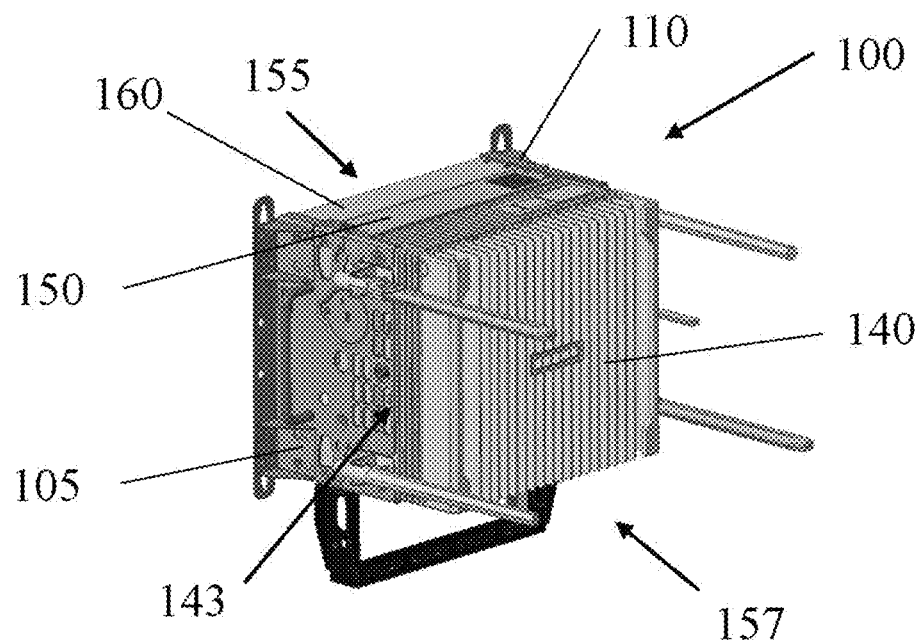
FIG. 4 is a perspective view of a computing device, a first expansion unit, and a second expansion unit in a mounting device, according to one or more examples of the present disclosure.

Referring to FIG. 4, a perspective view of computing device 140, expansion unit 150, and second expansion unit 160 in mounting device 100, according to one or more examples of the present disclosure is shown. FIG. 4 shows mounting device 100, computing device 140, and first expansion unit 150 that include substantially the same components as explained above with respect to FIGS. 2 and 3. In this example, second expansion unit 160 is attached to distal end 155 of first expansion unit 150. Accordingly, in this implementation, main chassis 143 includes at least first side panel 105, second side panel 110, computing device 140, expansion unit 150, and second expansion unit 160.

Second expansion unit 160 may include additional computing components, thereby expanding the functionality of computing device 140 and/or first expansion unit 150. For example, second expansion unit 160 may include additional memory, storage devices, PCI-E devices, network communication devices, or other devices that may be used in particular implementations.

Second expansion unit 160 may be connected to first expansion unit 150 through one or more connectors (not shown), such as those discussed above with respect to first expansion unit 150 and computing device 140. As such, second expansion unit 160 may provide additional scalable options for increasing the functionality of computing device 140 and first expansion unit 150 without replacing one or both of computing device 140 and/or first expansion unit 150.

As illustrated, in this example, computing device 140 is attached to first side panel 105 and second side panel 110 at a location closer to proximate end 157, relative to the location of the attachment of computing device 140 as illustrated in FIGS. 2 and 3. Computing device 140 is attached to first side panel 105 and second side panel 110 using four securing devices per panel in FIGS. 1 and 2. In this example, computing device 140 is attached to first side panel 105 with two securing devices and second side panel 110 with two additional securing devices. Because computing device 140, first expansion unit 150, and second expansion 150 may be attached at various locations on first side panel 105 and second side panel 110, mounting device 100 may provide scalability and expansion as functionalities of an operation change. For example, to modify main chassis 143, computing device 140 may be unattached from first side panel 105 and second side panel 110 and repositioned, such as at a location further to the proximate end 157 of first side panel 105 and second side panel 110. First expansion unit 150 and/or second expansion 160 unit may subsequently be positioned where computing device 140 was previously located. Main chassis 143 may thus be reconfigured to meet changes in operational conditions.

Figure 5:
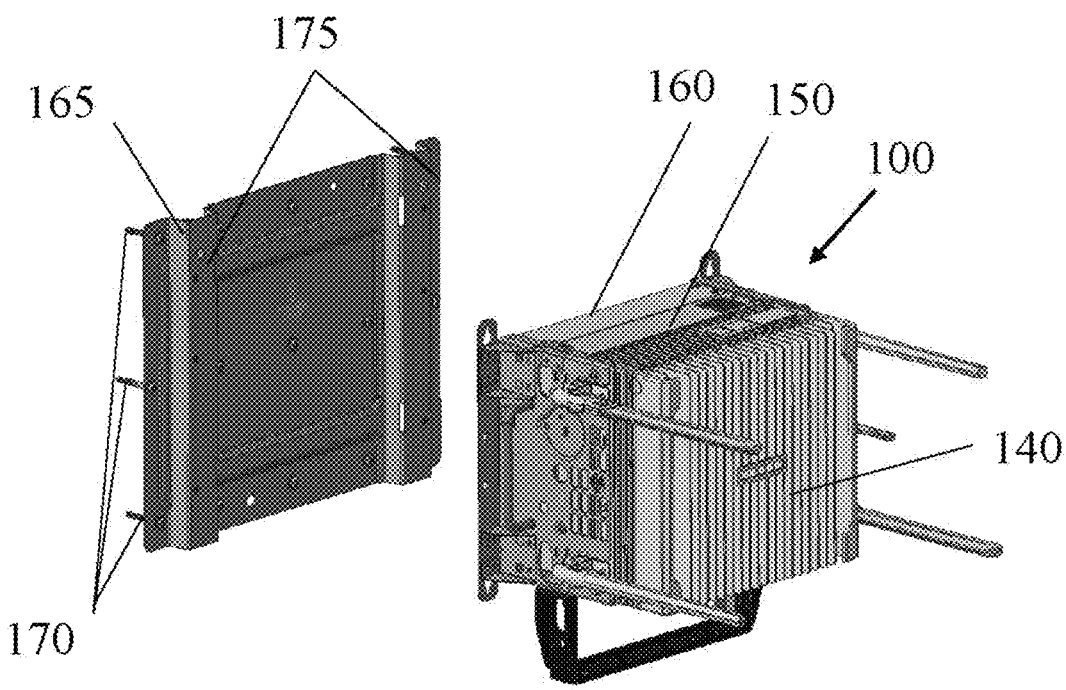
FIG. 5 is a perspective view of a computing device, an expansion unit, and a second expansion unit in a mounting device before attachment to a wall mount bracket, according to one or more examples of the present disclosure.

Referring to FIG. 5, a perspective view of computing device 140, expansion unit 150, and second expansion unit 160 in mounting device 100 before attachment to wall mounting bracket 165, according to one or more examples of the present disclosure is shown. In this example, computing device 140 is connected to first expansion unit 150, which is connected to second expansion unit 160, as described above with respect to FIG. 4. Wall mounting bracket 165 may be secured to a wall (not shown) using securing devices 170. Securing devices 170 may include, for example, nails, screws, bolts, anchors, rivets, or other physical securing devices. Wall mounting bracket 165 may be formed from various materials including, for example, metals, metal alloys, plastics, composites, and the like. In one implementation, wall mounting bracket 165 may be formed from stainless steel.

Wall mounting bracket 165 may also include one or more spools 175. Spools 175 may include a projection extending outwardly from wall mounting bracket 165. Spool 175 may thereby allow first side panel 105 and second side panel 110 to hang therefrom during installation, which will be discussed below with respect to FIG. 6.

Figure 6:
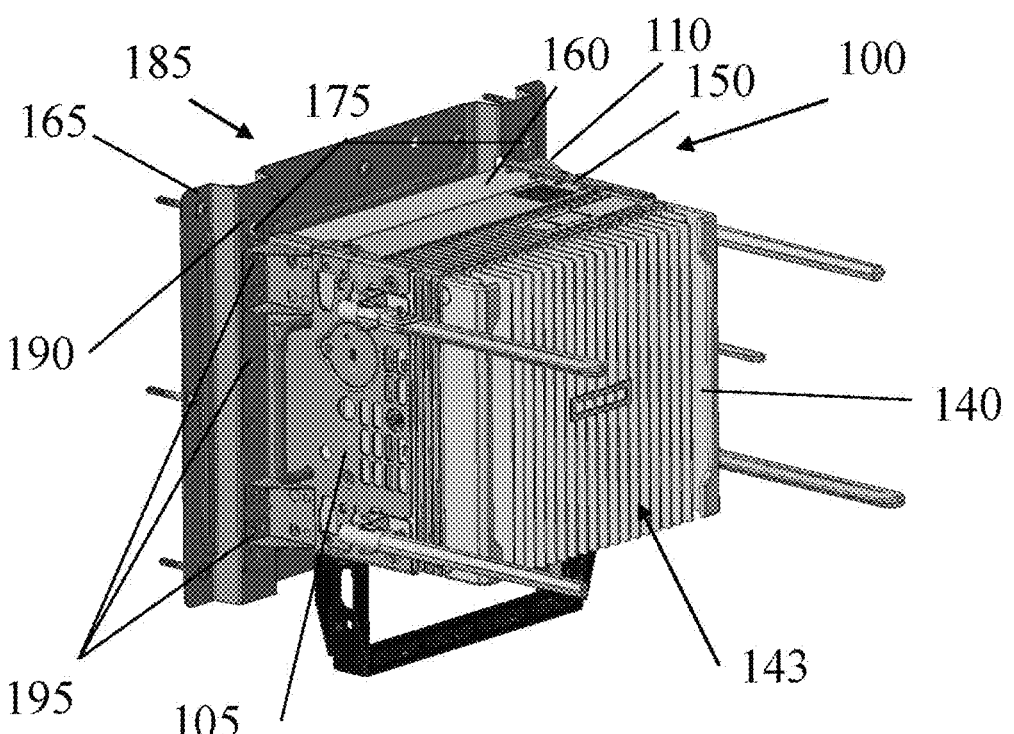
FIG. 6 is a perspective view of a computing device, an expansion unit, and a second expansion unit in a mounting device after installation, according to one or more examples of the present disclosure.

Referring to FIG. 6, a perspective view of computing device 140, expansion unit 150, and second expansion unit 160 in mounting device 100 after installation, according to one or more examples of the present disclosure is shown. In this example, computing device 140 is connected to first expansion unit 150, which is connected to second expansion unit 160, as described above with respect to FIGS. 4 and 5. The combination of computing device 140, and/or first expansion unit 150, and/or second expansion unit 160, connected together with mounting device 100 thereby forms main chassis 143.

During the installation of main chassis 143, wall mounting bracket 165 may be affixed to a wall (not shown). The wall may be located in a fixed location or a mobile location, as discussed above. The wall mounting bracket 165 may be affixed to the wall with the spools 175 oriented at a top portion 185 of wall mounting bracket 165. Main chassis 143 may be lifted into position such that mounting apertures 190 fit over spools 175. Mounting apertures 190 may have an eyedrop shape, with a relatively larger round section of the mounting aperture 190 at the bottom and a narrower section at the top. As such, when main chassis 143 is mounted to wall mounting bracket 165, the relatively larger round section of mounting apertures 190 may slide over spools 175 and then main chassis 143 may drop slightly so that the spools 175 hold main chassis 143 in place within the narrower section at the top of mounting apertures 190.

To secure main chassis 143 to wall mounting bracket 165, securing devices, such as those discussed above, may be inserted through side panel apertures 195 of first side panel 105 and second side panel 110 and into corresponding wall mounting bracket apertures 190, thereby removably securing main chassis 143 to wall mounting bracket 165.

To remove main chassis 143 from wall mounting bracket 165, the reverse procedure may be followed. Accordingly, securing devices may be removed from side panel apertures 195 and corresponding wall mounting bracket apertures (not shown) and main chassis 143 may be lifted upwardly so that mounting apertures 190 may clear spools 175. Main chassis 143 may then slide out of spools 175 and be removed from wall mounting bracket 165. A user may subsequently work on one or more devices of main chassis 143, at which point main chassis 143 may be remounted to wall mounting bracket 165, as discussed above.

Figure 7:
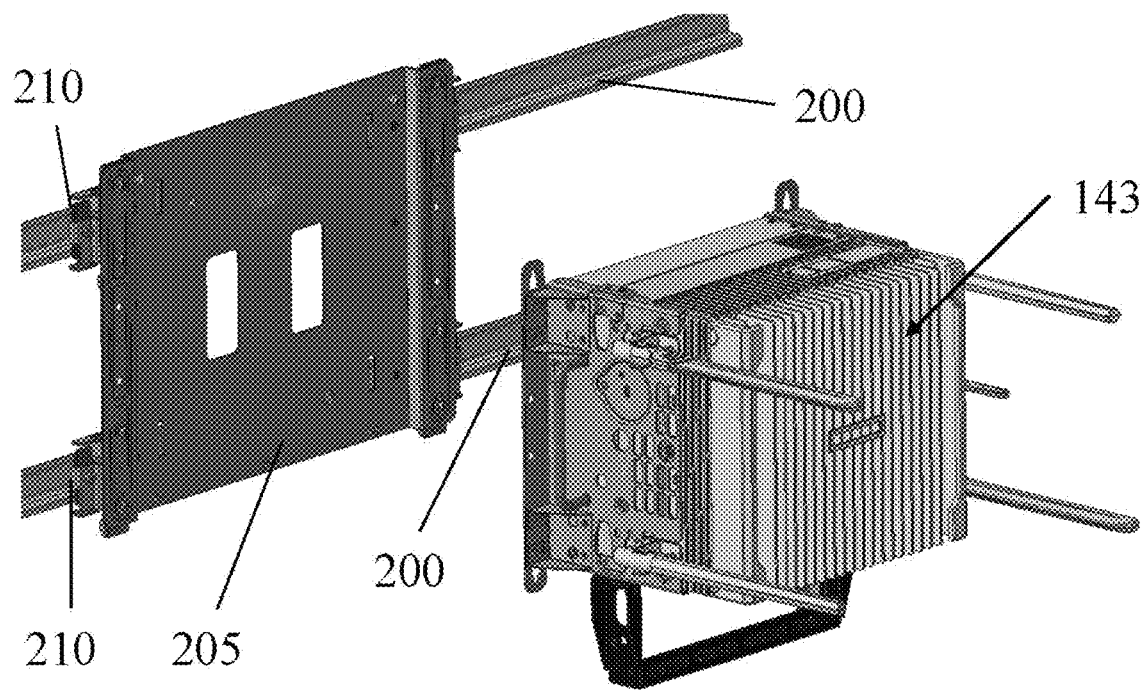
FIG. 7 is a perspective view of a system prior to installation on a DIN rail, according to one or more examples of the present disclosure.
Figure 8:
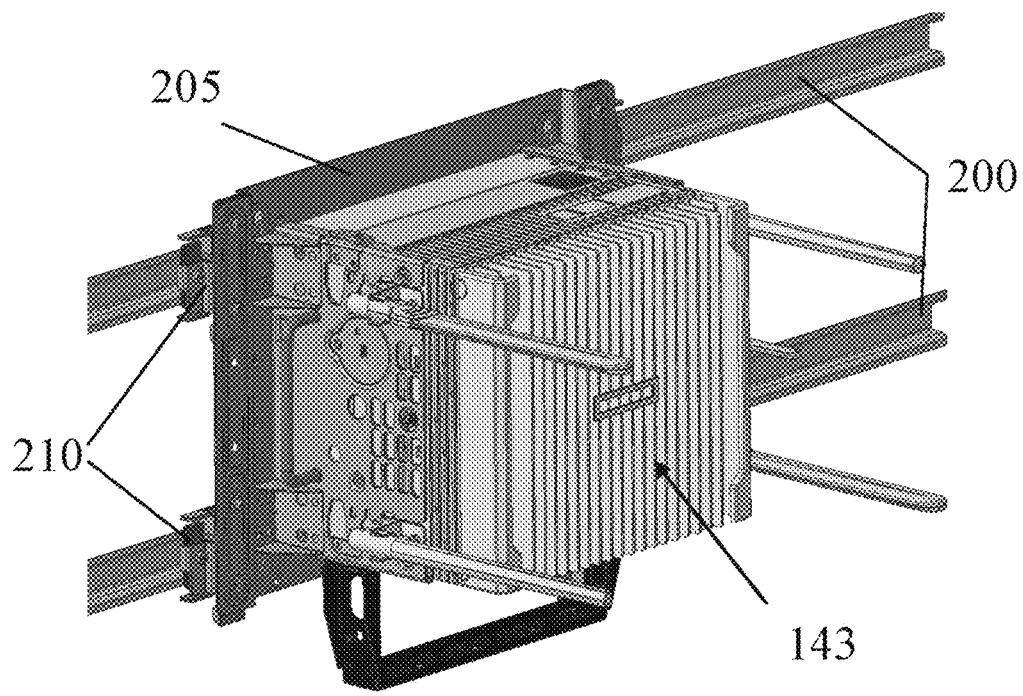
FIG. 8 is a perspective view of a system after installation on a DIN rail, according to one or more examples of the present disclosure.

Referring to FIGS. 7 and 8 together, a perspective view of main chassis 143 prior to installation on a DIN rail, and after installation on a DIN rail, respectively, according to one or more examples of the present disclosure is shown. In this example main chassis 143 may include one or more of the components discussed above with respect to FIGS. 1-6. For clarity, previously discussed components are not discussed in detail.

DIN rail 200 is a metal rail used to mount different types of equipment. DIN rail 200 may be formed from metals and metal alloys, such as cold rolled carbon steel with plated or coated surfaces. Different types of DIN rail 200 may be used in example implementations including, top hat sections, type O, type omega, c sections, and/or g sections.

In this implementation, wall mounting bracket 205 may be removably attached to one or more DIN rails 200. In this example, two DIN rails 200 are used, and as such, the wall mounting bracket 205 may be removably secured to DIN rails 200 using DIN clips 210. DIN clips 210 will be discussed in detail below.

To mount main chassis 143 to wall mounting bracket 205, main chassis 143 may be lifted into position such that mounting apertures 190 fit over spools 175. Main chassis 143 may then be secured to wall mounting bracket 205, as discussed above with respect to FIG. 6. Similarly, main chassis 143 may be removed from wall mounting bracket 205 when main chassis 143 is modified or replaced.

Figure 9:
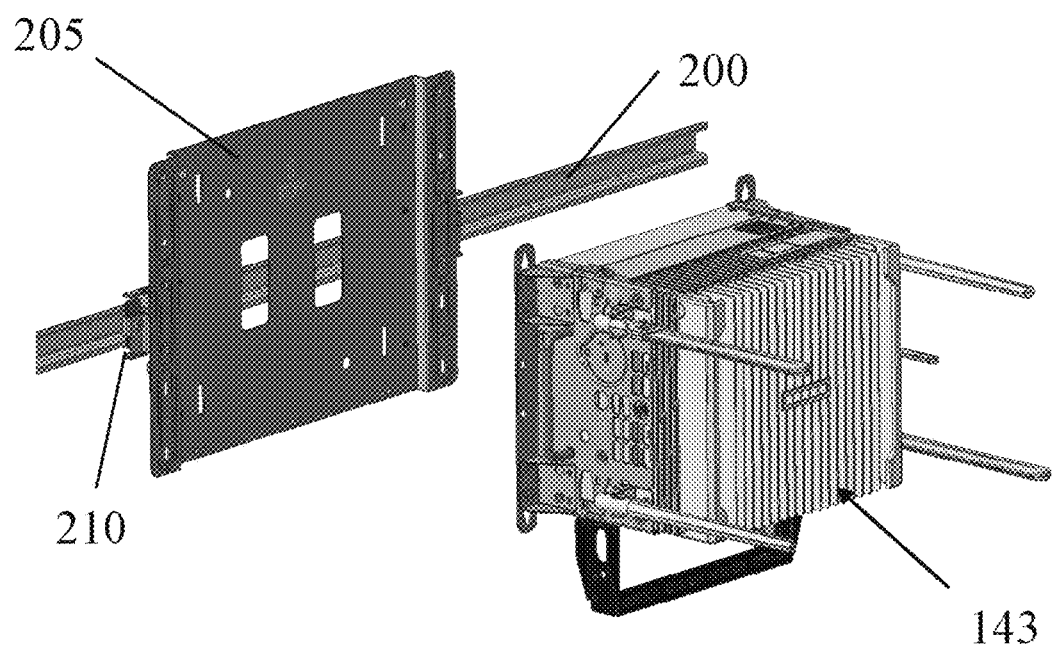
FIG. 9 is a perspective view of a system prior to installation on a DIN rail, according to one or more examples of the present disclosure.

Referring to FIG. 9, a perspective view of main chassis 143 prior to installation on a DIN rail 200, according to one or more examples of the present disclosure is shown. In this example, main chassis 143 may include one or more of the components discussed above with respect to FIGS. 1-8. For clarity, previously discussed components are not discussed in detail.

In this example, main chassis 143 may be mounted to wall mounting bracket 205 that is removably attached to a single DIN rail 200 using two DIN clips 210. Because there is a single DIN rail 200, two DIN clips 210 are used instead of the four DIN clips 210 used in a two DIN rail 200 system. As such, the DIN clips 210 are located at a relatively central location on wall mounting bracket 205 instead of along the periphery, as illustrated above with respect to FIGS. 7 and 8. Main chassis 143 may be removably attached and/or removed from wall mounting bracket 205 according to the procedure discussed in detail above with respect to FIGS. 5-8.

Figure 10:
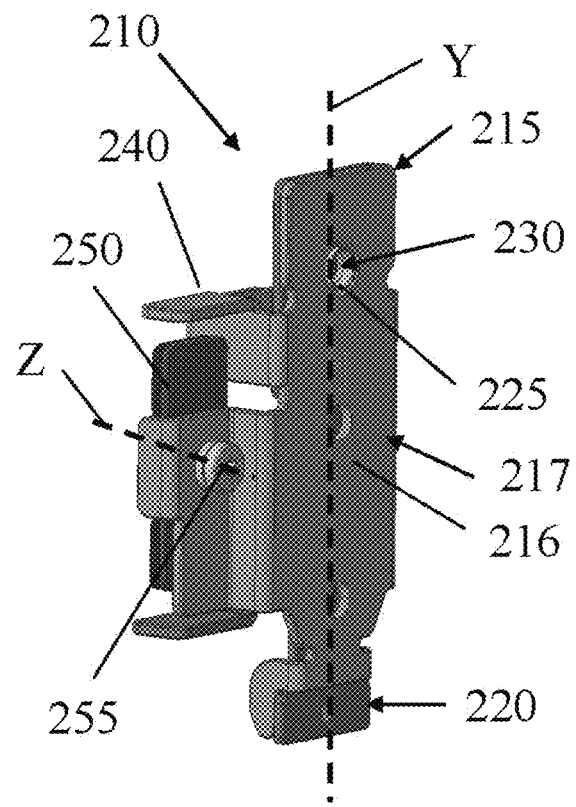
FIG. 10 is a perspective view of a DIN clip, according to one or more examples of the present disclosure
Figure 11:
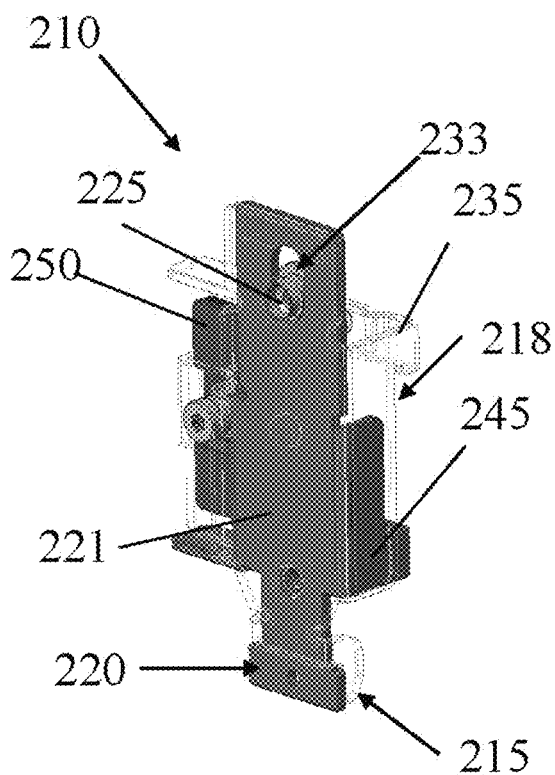
FIG. 11 is a perspective view of the DIN clip of FIG. 10 with the upper clip portion outlined, according to one or more examples of the present disclosure.
Figure 12:
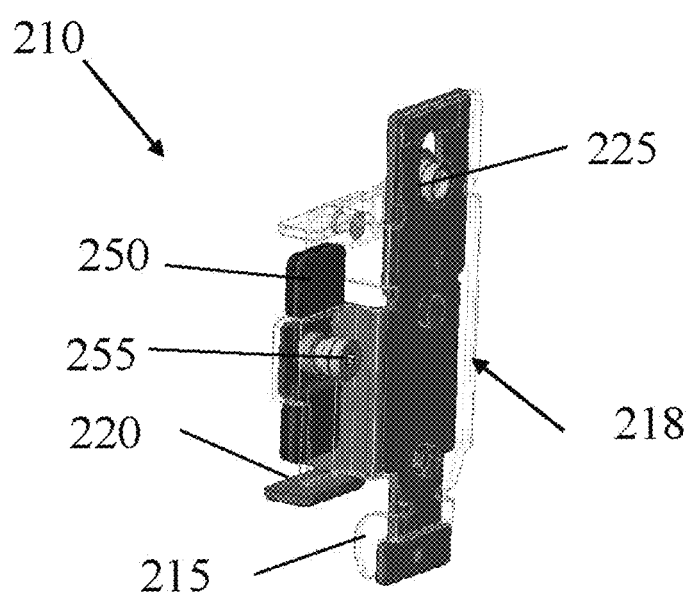
FIG. 12 is a perspective view of the DIN clip of FIG. 11, in reverse orientation, according to one or more examples of the present disclosure.

Referring to FIGS. 10, 11, and 12 together, FIG. 10 is a perspective view of a DIN clip 210, according to one or more examples of the present disclosure. FIG. 11 is a perspective view of the DIN clip 210 of FIG. 10 with an upper clip outlined, according to one or more examples of the present disclosure. FIG. 12 is a perspective view of the DIN clip 210 of FIG. 11, in reverse orientation, according to one or more examples of the present disclosure.

DIN clip 210 includes upper clip 215 and sliding clip 220. Upper clip 215 includes a clip body 216, a front side 217, and a back side 218. Similarly, sliding clip 220 has a second clip body 221, which is at least partially disposed within upper clip 215. Sliding clip 220 is configured to slide longitudinally along a Y axis, with respect to upper clip 220. A threated nut 225 is inserted within an upper clip aperture 230, and a sliding clip aperture 233. Sliding clip aperture 233, which may be elongated longitudinally, may thereby allow threaded nut 225 to move longitudinally therein. The longitudinal elongation of clip aperture 230 may there provide a range in which sliding clip 220 may slide with respect to upper clip 215.

Upper clip 215 may further include an upper projection 235, which in this example is a C-type connector. Upper projection 235 may extend azimuthally from back side 118 of clip body 216. Upper projection 235 may be used to slide over a top portion of a DIN rail (not shown), thereby allowing DIN clip 210, and any components attached thereto, to hang from DIN rail prior to securement. Upper clip 215 may also include a clip handle 240, which may include a lateral projection that may be used to slide upper clip 215 relative to sliding clip 220.

Sliding clip 220 may include a lower projection 245, which in this example is a C-type connector. Lower projection 245 may extend azimuthally from second clip body 221 in the same direction as upper projection 235. Lower projection 245 may be used to slide over a bottom portion of the DIN rail, thereby allowing DIN clip 210 to fit over the DIN rail prior to securement. Sliding clip 220 may slide longitudinally along the Y axis into contact with a bottom portion of the DIN rail, thereby allowing DIN clip 210 to be removably secured thereto. This procedure will be explained below in greater detail.

DIN clip 210 may also include a friction pad 250. Friction pad 250 may be connected to upper clip 215 with a set screw 255. Set screw 255 may be used to move friction pad 250 laterally along a Z axis with respect to upper clip 215. Friction pad 250 may thus be azimuthally movable with respect to upper clip 215. Tightening set screw 255 may move friction pad 250 away from upper clip 215, thereby bringing friction pad 250 and upper clip 215 further apart. Loosening set screw 255 may allow friction pad 250 to move closer together. The movement of friction pad 250 may thereby allow DIN clip 210 to tighten the connection between DIN clip 210 and a DIN rail.

Figure 13:
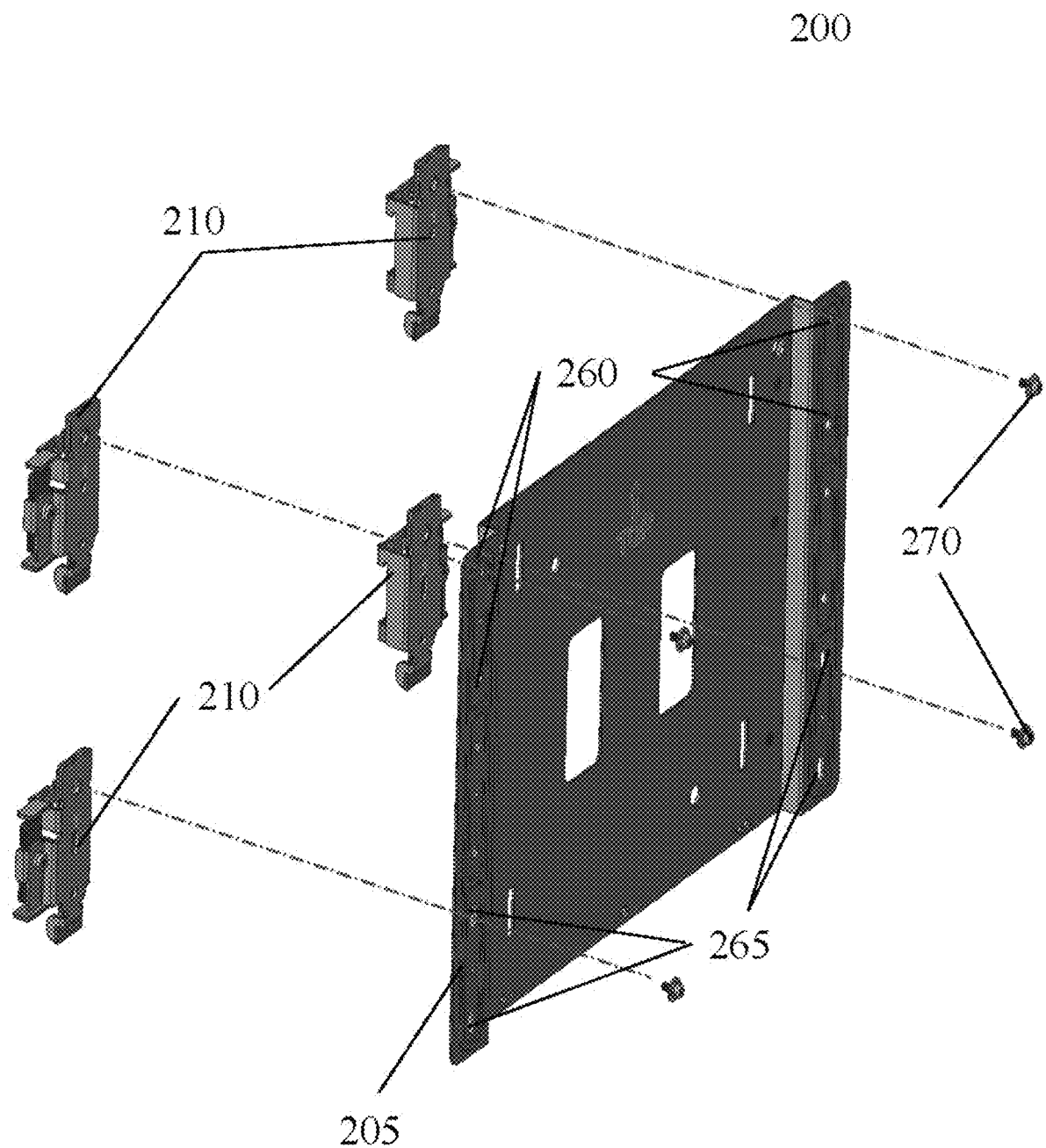
FIG. 13 is a perspective view of attaching DIN clips to a wall mounting bracket, according to one or more examples of the present disclosure.

Referring to FIG. 13, a perspective view of attaching DIN clips 210 to a wall mounting bracket 205, according to one or more examples of the present disclosure is shown. Wall mounting bracket 205 may define two pairs of top apertures 260 and two pairs of bottom apertures 265, thereby allowing DIN clips 210 to be secured thereto. As illustrated, during installation of DIN clips 210 to wall mounting bracket 205, the top two DIN clips 210 may be secured to wall mounting bracket 205 using a securing device 270. Securing devices 270 may include physical devices, such as those previously described.

To secure the top DIN clips 210 to the wall mounting bracket 205, one securing device 270 may be used to secure DIN clip 210 through the upper most aperture of each pair of top apertures 260. Thus, the bottom most aperture of each pair of the top apertures 260 is left unsecured.

Similarly, to loosely secure bottom DIN clips 210 to the wall mounting bracket 205, one securing device 270 may be used to secure DIN clip 210 through the upper most aperture of each pair of the bottom apertures 265. Thus, the bottom most aperture of each pair of the bottom apertures 265 is left unsecured. The connection is loose so that adjustments to the location of DIN clips 210 in response to DIN rail (not shown) orientation may occur during installation.

Figure 14:
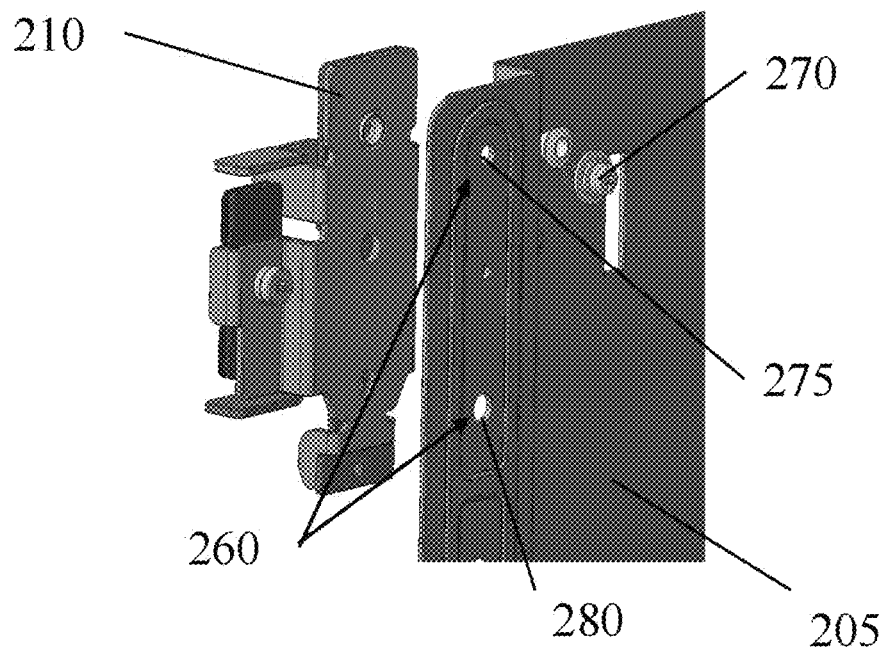
FIG. 14 is a close perspective view of attaching top DIN clips to a wall mounting bracket, according to one or more examples of the present disclosure.

Referring to FIG. 14, a close perspective view of attaching top DIN clips 210 to wall mounting bracket 205 according to one or more examples of the present disclosure is shown. In this example, DIN mounting bracket 205 defines a pair of top apertures 260. The pair of top apertures 260 include an upper top aperture 275 and a lower top aperture 280. During installation of DIN clips 210 to wall mounting bracket 205, a securing device 270 may be inserted into the upper top aperture 275. Top DIN clips 210 may then be secured to wall mounting bracket 205.

Figure 15:
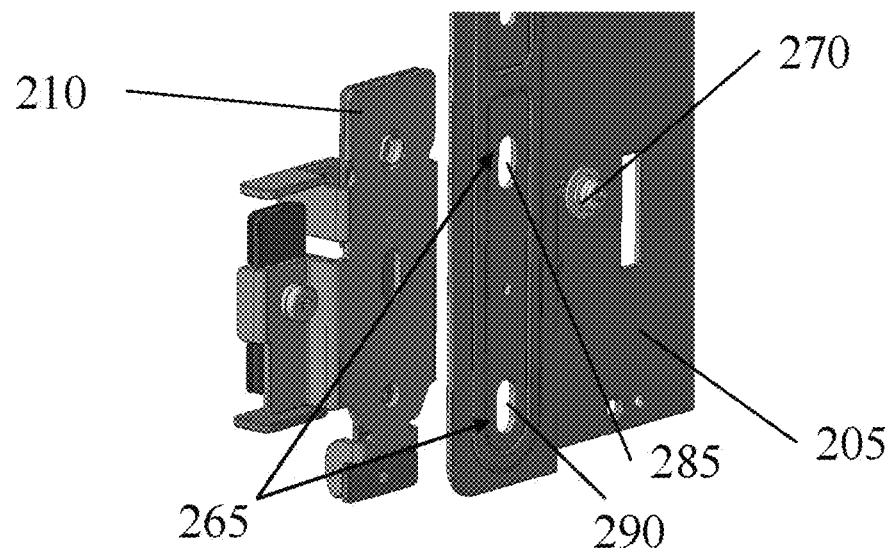
FIG. 15 is a close perspective view of attaching bottom DIN clips to a wall mounting bracket, according to one or more examples of the present disclosure.

Referring to FIG. 15, a close perspective view of attaching bottom DIN clips 210 to wall mounting bracket 205, according to one or more examples of the present disclosure is shown. In this example, wall mounting bracket 205 defines a pair of bottom apertures 265. The pair of bottom apertures 265 include an upper bottom aperture 285 and a lower bottom aperture 290. During installation of DIN clips 210 to wall mounting bracket 205, a securing device 270 may be inserted into the upper bottom aperture 285. Bottom DIN clips 210 may then be loosely secured to wall mounting bracket 205 by not fully tightening securing device 270. As explained above, by allowing the bottom DIN clip 210 to be loosely secured to wall mounting bracket 205, adjustments to DIN clips 210 may occur during installation.

To allow for the adjustments to DIN clip 210 orientation, upper bottom aperture 285 and/or lower bottom aperture 290 may be longitudinally elongated. Additionally, upper bottom aperture 285 and/or lower bottom aperture 290 may be laterally elongated. As such, DIN clip 210 may slide up and down, as well as from side to side, The movability of DIN clip 210 may thereby allow adjustments to occur during installation so that the DIN clips 210 may be securely attached to corresponding DIN rails (not shown).

Figure 16:
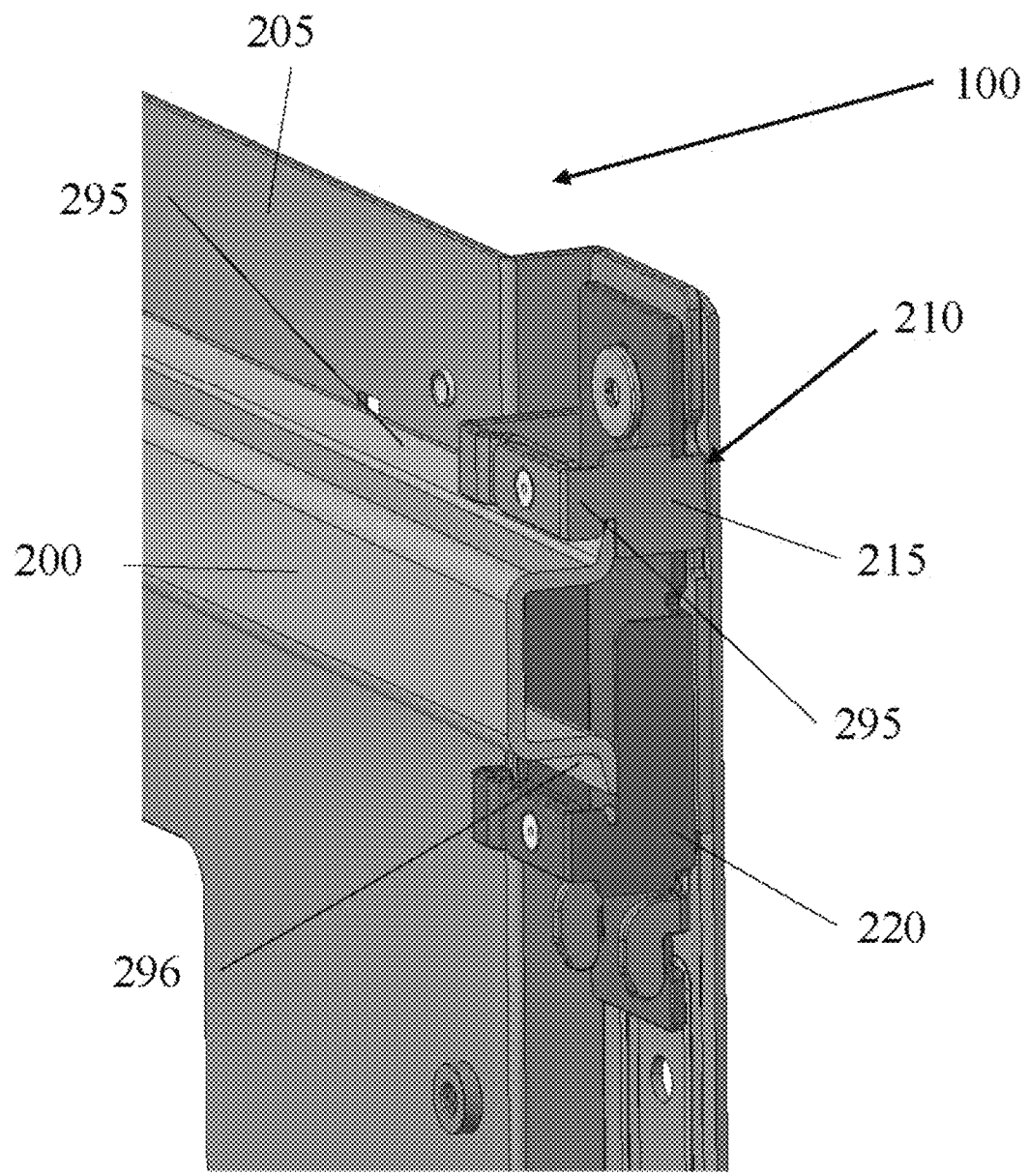
FIG. 16 is a close perspective view of a mounting device installed on a DIN rail, according to one or more examples of the present disclosure.

Referring to FIG. 16, a close perspective view of a mounting device 100 installed on DIN rail 200, according to one or more examples of the present disclosure is shown. During installation the top DIN clip 210 is secured to the wall mounting bracket 205, as explained above with respect to FIG. 14. Top DIN clip 210 is then slid over a DIN rail 200 top edge 295 so that the top edge 295 is in contact with the upper projection 235 of upper clip 215. Sliding clip 220 is then in a lowered position and is able to slide underneath a bottom edge 300 of DIN rail 200. Because a securing device (not illustrated) was not inserted into lower top aperture (not shown) of wall mounting bracket 205, the DIN clip 210 may fit over DIN rail 200, prior to final securement. DIN clips 210 may then be secured against the DIN rails 200, which will be explained in detail with respect to FIG. 17.

Figure 17:
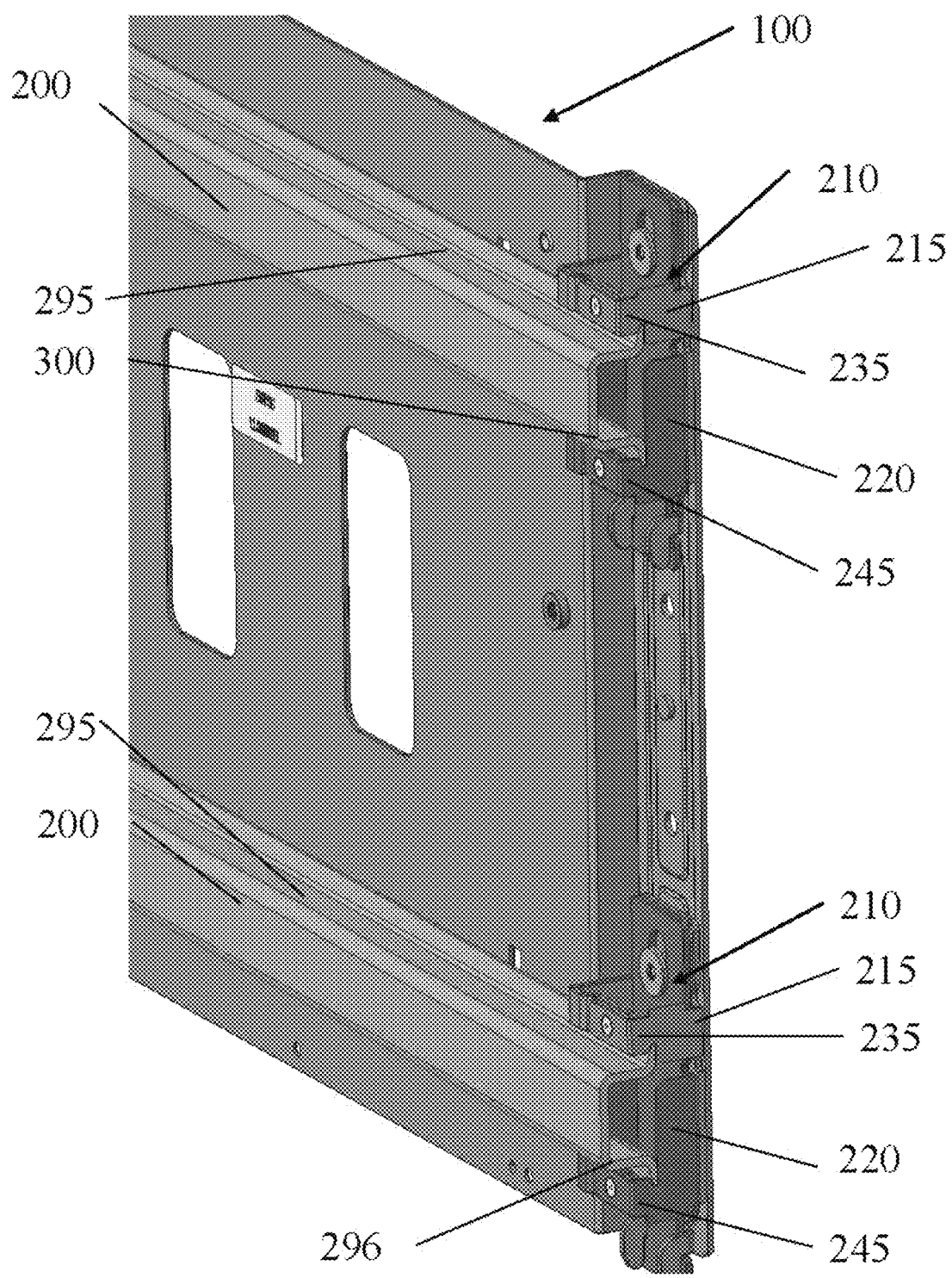
FIG. 17 is a perspective view of a mounting device attached to two DIN rails, according to one or more examples of the present disclosure.

Referring to FIG. 17, a perspective view of a mounting device 100 attached to two DIN rails 200, according to one or more examples of the present disclosure is shown. In this example, DIN clips 210 are attached to corresponding DIN rails 200. The top edges 295 of DIN rails 200 are in contact with the upper projections 235 of the upper clips 215 of DIN clips 210. Similarly, the bottom edges 300 of DIN rails 200 are in contact with the lower projections 245 of the sliding clips 220 of DIN clips 210.

To form the secured connection, the sliding clips 220 may be slid longitudinally upward until the lower projections 245 are in contact with the bottom edges 300 of the DIN rails 200. To secure the DIN clips 210 in place, a securing device (not shown) may be inserted through apertures in DIN clips 210 that correspond to the lower top apertures (not shown) and the lower bottom apertures (not shown) of wall mounting bracket 205. The securing device may then be tightened to secure the connection between the mounting device 100 and the DIN rails 200.

Figure 18:
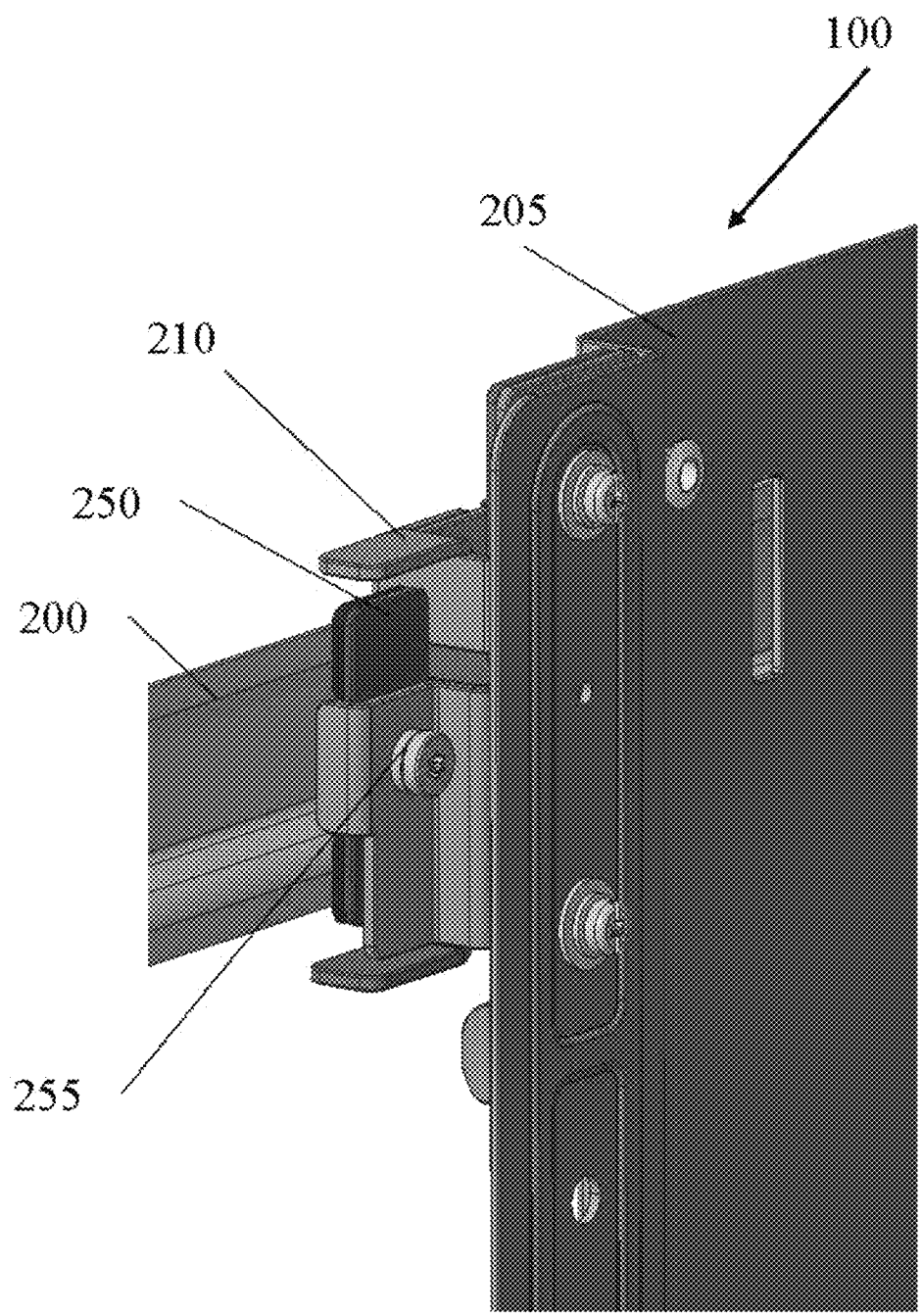
FIG. 18 is a perspective view of a mounting device attached to a DIN rail, according to one or more examples of the present disclosure.

Referring to FIG. 18, a perspective view of a wall mounting bracket 205 attached to a DIN rail 200, according to one or more examples of the present disclosure is shown. In this example, the connection between mounting device 100 and a DIN rail 200 may be further tightened through tightening of friction pad 250. To tighten the connection therebetween, set screw 255 may be tightened, so that friction pad 250 presses against DIN rail 200. When set screw 255 is fully tightened, friction pad 250 may press firmly against DIN rail 200 thereby preventing movement between mounting device 100 and DIN rail 200.

While the above examples illustrated a system having two DIN rails 200, in other implementations a one DIN rail 200 may be used. In such an implementation, two DIN clips 210 may attach mounting device 100 to one DIN rail 200 by attaching the DIN clips 210 at a center portion of wall mounting bracket 205, as discussed above. Such an implementation may be used when the load of components attached to wall mounting bracket 205 is relatively small.

Figure 19:
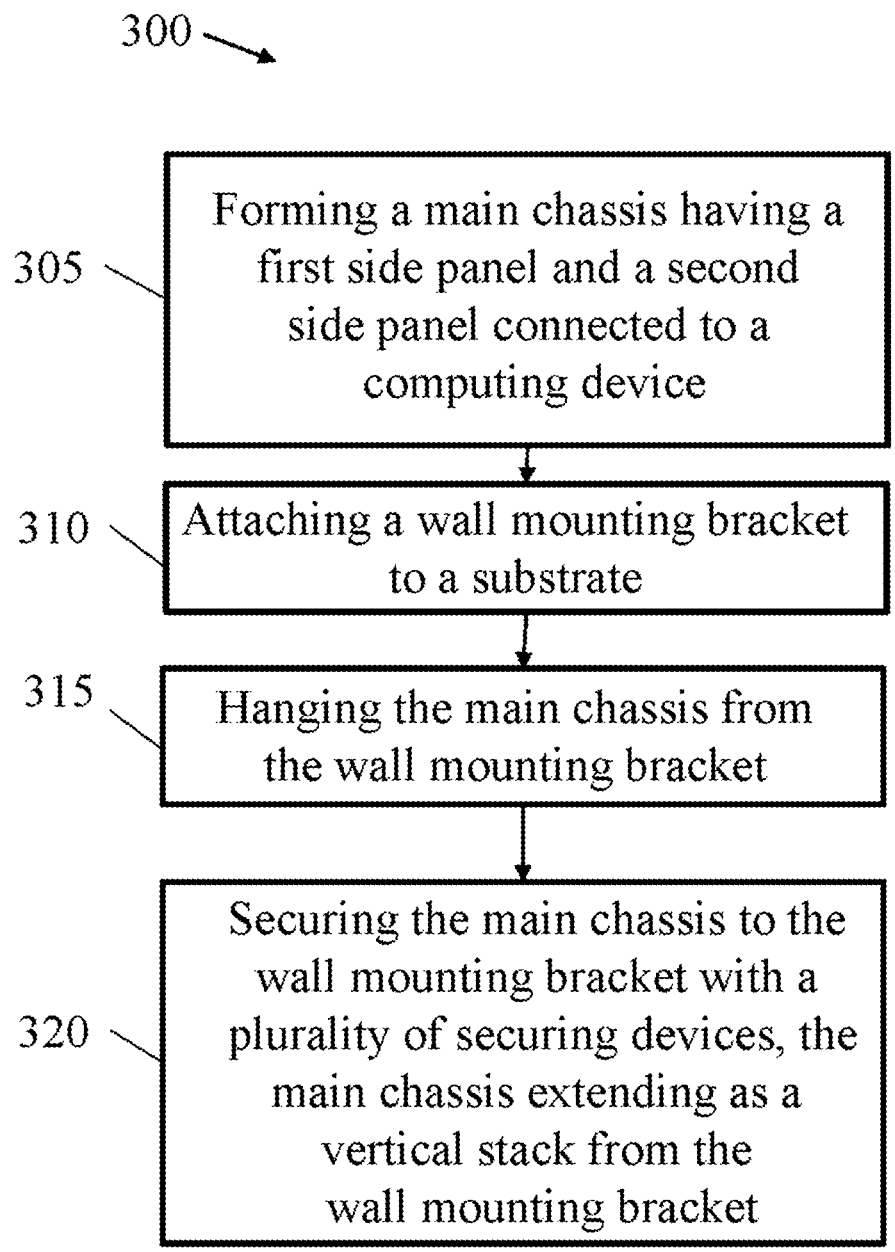
FIG. 19 is a flowchart depicting a method for mounting a computing device, according to one or more examples of the present disclosure.

Referring to FIG. 19, a flowchart depicting a method for mounting a computing device, according to one or more examples of the present disclosure is shown. Method 300 may include forming (block 305) a main chassis having a first side panel and a second side panel connected to a computing device. The main chassis may include, for example, a computing device, a first side panel, and a second side panel. The main chassis may further include other components, such as, a first expansion unit, a second expansion unit, a handle, a cable management bracket, etc.

Method 300 may further include attaching (block 310) a wall mounting device to a substrate. The substrate may include, for example, a wall that is formed from brick, concrete, metal, etc. The substrate may also include a rail-based mounting system, such as the DIN rail systems discussed in detail above. Attaching the wall mounting device may include physically securing the wall mounting device to a wall or may include attaching the wall mounting device to other components, such as DIN rails.

Method 300 may further include sliding a spool on the wall mounting device through a first mounting aperture defined by the first side panel and a second mounting aperture defined by the second panel.

Method 300 may further include hanging (block 315) the main chassis from the wall mounting device. This may allow adjustments to the wall mounting bracket, components thereof, and/or components of the main chassis. Adjustments may include changing the lateral or longitudinal orientation of the wall mounting bracket, main chassis, or other components used in hanging wall mounting bracket and/or main chassis.

Method 300 may further include securing (block 320) the main chassis to the wall mounting device with a plurality of securing devices. The main chassis may thus extend as a vertical stack from the wall mounting device. Securing the main chassis may include tightening one or more securing devices, such as the devices discussed above.

In certain implementations, expansion units may be added to the main chassis. For example, in one implementation a single expansion unit may be added to the main chassis by connecting the expansion unit to the first side panel, the second side panel, and the computing device. The main chassis may then be reinstalled on the wall mounting bracket and vertically stacked on a wall. In other implementations, a main chassis may be formed that includes two expansion units. In such an implementation, the computing device, the first expansion unit, and the second expansion unit may be connected to the first side panel and the second side panel. The main chassis may then be reinstalled on the wall mounting bracket and vertically stacked on the wall.

In other example implementations, mounting the computing device may include mounting a main chassis using DIN clips to attach the wall mounting bracket to a DIN rail. In such an example, DIN clips may be attached to the wall mounting bracket according to the process explained above. The DIN clips may subsequently be attached to DIN rails and adjusted so the main chassis is securely attached to the DIN rail system.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

While the present teachings have been described in conjunction with various examples, it is not intended that the present teachings be limited to such examples. The above-described examples may be implemented in any of numerous ways.

Also, the technology described herein may be embodied as a method, of which at least one example has been provided. The acts performed as part of the method may be ordered in any suitable way. Accordingly, examples may be constructed in which acts are performed in an order different than illustrated, which may include performing some acts simultaneously, even though shown as sequential acts in illustrative examples.

Advantages of one or more example embodiments may include one or more of the following:

In one or more examples, systems and methods disclosed herein may be used to vertically stack a main chassis. Vertically stacking the main chassis may thereby allow scalability to a computing device and associated components, allowing the computing device to be updated in response to operational changes.

In one or more examples, systems and methods disclosed herein may be used to attach computing devices to walls or DIN rails, where the computing devices may be updated through expansion units.

In one or more examples, systems and methods disclosed herein may be used to provide flexibility in a computing device mounting system that allows for multiple configurations of devices without having to replace entire computing systems.

In one or more examples, systems and methods disclosed herein may be used to provide secure configurations capable of withstanding shock and/or vibration, while allowing computing devices to be stacked vertically on a wall or other substrate.

Not all embodiments will necessarily manifest all these advantages. To the extent that various embodiments may manifest one or more of these advantages, not all of them will do so to the same degree.

While the claimed subject matter has been described with respect to the above-noted embodiments, those skilled in the art, having the benefit of this disclosure, will recognize that other embodiments may be devised that are within the scope of claims below as illustrated by the example embodiments disclosed herein. Accordingly, the scope of the protection sought should be limited only by the appended claims.

What is claimed is:

1. A system comprising:
   a wall mounting bracket having a front side and a back side; and
   a main chassis connected to the front side of the wall mounting bracket, the main chassis including:
     a first side panel removably connected to the front side of the wall mounting bracket;
     a second side panel removably connected to the front side of the wall mounting bracket; and
     a computing device having a first side and a second side, the first side removably attached to the first side panel and the second side removably attached to the second side panel.

2. The system of claim 1, further comprising a cable management bracket attached to the first side panel and the second side panel.

3. The system of claim 1, further comprising at least one handle connected to at least one of the first side panel and the second side panel.

4. The system of claim 1, further comprising at least one spool disposed on the front side of the wall mounting bracket, the at least one spool insertable into at least one mounting aperture defined by the first side panel and the second side panel.

5. The system of claim 1, further comprising an expansion unit disposed between the computing device and the front side of the wall mounting bracket.

6. The system of claim 5, further comprising a second expansion unit disposed between the first expansion unit and the front side of the wall mounting bracket.

7. The system of claim 1, further at least two DIN clips disposed on the back side of the wall mounting bracket.

8. The system of claim 7, the at least two DIN clips comprising:
   an upper clip having a clip body, a front side, and a back side, the back side having an upper projection that extends azimuthally from the clip body; and
   a sliding clip disposed at least partially within upper clip and slidably connected to the upper clip with a threaded nut, the sliding clip longitudinally slidable with respect to the upper clip.

9. The system of claim 8, further comprising a friction pad disposed on the upper clip, the friction pad having a set screw that moves the friction pad azimuthally with respect to the upper clip.

10. A DIN clip comprising:
    an upper clip having a clip body, a front side, and a back side, the back side having an upper projection that extends azimuthally from the clip body;
    a sliding clip having a second clip body, the second clip disposed at least partially within upper clip and slidably connected to the upper clip with a threaded nut, the sliding clip longitudinally slidable with respect to the upper clip, and having a lower projection that extends azimuthally from the second clip body; and
    a friction pad disposed on the back side of the upper clip, the friction pad releasably secured to the upper clip with a set screw, the friction pad azimuthally moveable with respect to the upper clip.

11. The DIN clip of claim 10, wherein the upper clip defines an upper clip aperture and the sliding clip defines a sliding clip aperture, wherein the sliding clip aperture is longitudinally longer than the upper clip aperture.

12. The DIN clip of claim 11, wherein the upper clip defines a second upper clip aperture and the sliding clip defines a second sliding clip aperture.

13. The DIN clip of claim 10, further comprising a handle laterally extending from the clip body of the upper clip.

14. The DIN clip of claim 10, wherein the upper projection and the lower projection engage a DIN rail.

15. The DIN clip of claim 10, wherein the friction pad engages a DIN rail.

16. A method for mounting a computing device, the method comprising:
    forming a main chassis having a first side panel and a second side panel connected to the computing device;
    attaching a wall mounting bracket to a substrate;
    hanging the main chassis from the wall mounting bracket; and
    securing the main chassis to the wall mounting bracket with a plurality of securing devices, the main chassis extending as a vertical stack from the wall mounting bracket.

17. The method of claim 16, further comprising adding an extension unit to the main chassis.

18. The method of claim 17, further comprising sliding a spool on the wall mounting bracket through a first mounting aperture defined by the first side panel and a second mounting aperture defined by the second side panel.

19. The method of claim 16, further comprising:
    attaching at least two DIN clips to the wall mounting bracket; and
    attaching the at least two DIN clips to a DIN rail included in the substrate.

20. The method of claim 19, wherein the at least two DIN clips each comprise:
    an upper clip having a clip body, a front side, and a back side, the back side having an upper projection that extends azimuthally from the clip body; and
    a sliding clip disposed at least partially within upper clip and slidably connected to the upper clip with a threaded nut, the sliding clip longitudinally slidable with respect to the upper clip.

* * * * *